(12) United States Patent
Bellaouar (10) Patent No.: US 11,380,993 B2
(45) Date of Patent: Jul. 5, 2022

(54) TRANSCEIVER FRONT-END WITH RECEIVER BRANCH MATCHING NETWORK INCLUDING INTEGRATED ELECTROSTATIC DISCHARGE PROTECTION

(71) Applicant: GLOBALFOUNDRIES U.S. Inc., Malta, NY (US)

(72) Inventor: Abdellatif Bellaouar, Richardson, TX (US)

(73) Assignee: GlobalFoundries U.S. Inc., Malta, NY (US)

( * ) Notice: Subject to any disclaimer, the term of this patent is extended or adjusted under 35 U.S.C. 154(b) by 352 days.

(21) Appl. No.: 16/720,279

(22) Filed: Dec. 19, 2019

(65) Prior Publication Data
US 2021/0194125 A1 Jun. 24, 2021

(51) Int. Cl.
*H01Q 5/335* (2015.01)
*H03F 1/08* (2006.01)
*H04B 1/44* (2006.01)

(52) U.S. Cl.
CPC ............ *H01Q 5/335* (2015.01); *H03F 1/086* (2013.01); *H04B 1/44* (2013.01); *H03F 2200/294* (2013.01)

(58) Field of Classification Search
CPC ..... H01Q 5/335; H03F 3/245; H03F 3/45475; H03F 3/195
See application file for complete search history.

(56) References Cited

U.S. PATENT DOCUMENTS 6,982,609 B1 * 1/2006 McKay ................. H03F 3/60
 336/232
7,609,493 B1 10/2009 Salman et al.
(Continued)

FOREIGN PATENT DOCUMENTS

CN 103166592 A 6/2013
CN 104185955 A 12/2014
(Continued)

OTHER PUBLICATIONS

Bronckers et al., "Wireless Receiver Architectures Towards 5G: Where Are We?", IEEE Circuits and Systems Magazine, 2017, pp. 6-16.
(Continued)

*Primary Examiner* — Lam T Mai
(74) *Attorney, Agent, or Firm* — Gibb & Riley, LLC; David A Cain, Esq.

(57) ABSTRACT

Disclosed are embodiments of a transceiver front-end configured for a reduced noise figure (NF). Each of the embodiments includes an antenna, a transmitter branch and a receiver branch all connected to an input/output pad. The transmitter branch is coupled to the input/output pad (and thereby the antenna) by an impedance transformer. Only the receiver branch is selectively electrically connected to the input/output pad (and thereby the antenna) by a switch. A common matching network between the input/output pad and the switch provides both impedance matching and electrostatic discharge protection for the switch and the low noise amplifier, thereby reducing NF. Specific embodiments are disclosed for integration into specific technologies (e.g., fully depleted silicon-on-insulator (FDSOI) technology and fin-type field effect transistor (finFET) technology).

20 Claims, 8 Drawing Sheets

(56) References Cited

U.S. PATENT DOCUMENTS

| | | | |
|---|---|---|---|
| 9,406,695 | B2 | 8/2016 | Shapiro et al. |
| 9,496,110 | B2 * | 11/2016 | Johnson ............. H01H 59/0009 |
| 9,559,747 | B1 | 1/2017 | Garcia et al. |
| 9,859,403 | B1 * | 1/2018 | Breil ................... H01L 29/0847 |
| 10,116,347 | B1 * | 10/2018 | Xu ........................... H04B 1/44 |
| 10,141,971 | B1 | 11/2018 | Elkholy et al. |
| 11,177,842 | B1 * | 11/2021 | Kim ......................... H04B 1/44 |
| 2007/0085754 | A1 * | 4/2007 | Ella ...................... H04B 1/0458 343/862 |
| 2011/0195670 | A1 * | 8/2011 | Dakshinamurthy . H04B 7/0682 455/73 |
| 2013/0331043 | A1 * | 12/2013 | Perumana .............. H04B 1/525 455/78 |
| 2014/0104132 | A1 * | 4/2014 | Bakalski ................. H01L 23/66 333/32 |
| 2015/0173091 | A1 | 6/2015 | Ratasuk et al. |
| 2016/0126618 | A1 * | 5/2016 | Strange .................... H03H 7/38 343/861 |
| 2018/0316382 | A1 | 11/2018 | Xu |
| 2020/0125694 | A1 * | 4/2020 | Gupta ................... G06F 30/333 |

FOREIGN PATENT DOCUMENTS

| | | |
|---|---|---|
| CN | 105959027 A | 9/2016 |
| CN | 109004925 A | 12/2018 |
| CN | 109525262 A | 3/2019 |
| TW | 201315167 A | 4/2013 |
| TW | 201613280 A | 1/2016 |
| WO | 2014/054908 A1 | 4/2014 |

OTHER PUBLICATIONS

Dunworth et al., "28GHz Phased Array Transceiver in 28nm Bulk CMOS for 5G Prototype User Equipment and Base Stations", IEEE/MTT-S International Microwave Symposium, 2018, pp. 1330-1333.

Paramesh et al., "Wideband Millimeter-Wave Beamforming Receivers in Silicon", IEEE IMS/RFIC Workshop, 2015, pp. 1-34.

Wang et al., "A study of Impacts of ESD Protection on 28/38GHz RF Switches in 45nm SOI CMOS for 5G Mobile Applications", IEEE Radio and Wireless Symposium (RWS), 2018, pp. 157-160.

Wang et al., "ESD and RF Switch Co-Design in SOI CMOS for Smartphones from 2G to 5G", IEEE, Texas Symposium on Wireless and Microwave Circuits and Systems (WMCS), 2018, pp. 1-4.

Jung, Won-Chae, "A Study of the Boron Profiles Caused by BF2 Implantation in Crystalline Silicon", Journal of the Korean Physical Society, vol. 46, No. 5, 2005, pp. 1218-1223.

CN Application No. 202011300882.5, Office Action Communication dated Mar. 1, 2022, pp. 1-9.

CN Application No. 202011300882.5, Search Report dated Feb. 22, 2022, pp. 1-5.

Balasubramanian et al., "RF/mmWave Front-End Module Switch in 22nm FDSOI Process," IEEE, 2018, Abstract.

Shi et al., "A 2.4GHz T/R Switch with ESD Protection for WLAN 802.11 b/g/n Applications," IEEE, 2017, Abstract.

TW Application No. 109140540, KUS007-TW-NP, Office Action Communication dated Mar. 22, 2022, pp. 1-5.

* cited by examiner

FIG. 4C

TRANSCEIVER FRONT-END WITH RECEIVER BRANCH MATCHING NETWORK INCLUDING INTEGRATED ELECTROSTATIC DISCHARGE PROTECTION

BACKGROUND

Field of the Invention

The present invention relates to transceiver front-ends and, more particularly, embodiments of a transceiver front-end having a reduced noise figure (NF).

Description of Related Art

More specifically, those skilled in the art will recognize that a transceiver is a device that includes both a transmitter and a receiver, which share a common antenna or antenna array. The transceiver front-end refers to the circuitry within the transceiver from the antenna to and including a power amplifier in the transmitter branch and also to and including a low noise amplifier of the receiver branch. In a conventional transceiver front-end architecture, the antenna is connected to an input/output pad and a switch selectively connects either the transmitter branch or the receiver branch to the input/output pad and, thereby to the antenna. An electrostatic discharge (ESD) protection structure (e.g., a shunt inductor or other ESD protection structure) is typically integrated between the input/output pad and the switch in order to protect the switch and other components in the front-end. An impedance matching network is typically integrated into the receiver branch between the switch and the low noise amplifier. The estimated noise figure (NF) for a transceiver front-end configured in this manner can be relatively high due to the ESD protection structure and the switch in combination with the low noise amplifier. Therefore, there is a need in the art for an improved transceiver front-end configured to have a reduced NF.

SUMMARY

In view of the foregoing, disclosed herein are embodiments of a transceiver front-end configured for a reduced noise figure (NF). Generally, each of the embodiments disclosed herein includes an antenna, a transmitter branch and a receiver branch all connected to an input/output pad. The transmitter branch is coupled to the input/output pad (and thereby the antenna) by an impedance transformer. Only the receiver branch is selectively electrically connected to the input/output pad (and thereby the antenna) by a switch. A common matching network upstream of the switch provides both impedance matching and electrostatic discharge protection for the switch and the low noise amplifier, thereby reducing NF. Specific embodiments are also disclosed for integration into different technologies (e.g., fully depleted silicon-on-insulator (FDSOI) technologies and fin-type field effect transistor (finFET) technologies). In any case, the transceiver front-end configuration has the added advantages of removing the switch from the transmitter branch (thereby avoiding power loss of output signals) and further avoiding the need for a negative bias on the switch when in the off-mode (i.e., when the transceiver is in the transmit mode).

More particularly, generally disclosed herein are embodiments of transceiver front-end, which is operable in a transmitter mode and a receiver mode and which is configured for a reduced noise figure (NF). The transceiver front-end can include an antenna, a transmitter branch and a receiver branch, which are all connected to an input/output pad. The transmitter branch can include a power amplifier and an impedance transformer. During the transmit mode, the power amplifier can generate output signals. The impedance transformer can couple the power amplifier to the input/output pad, thereby allowing the antenna to transmit the output signals. The receiver branch can include a low noise amplifier, a switch, and a matching network. The switch can alternatively disconnect the low noise amplifier from the input/output pad or connect the low noise amplifier to the input/output pad. When the low noise amplifier is disconnected from the input/output pad by the switch, the transceiver front-end operates in the transmit mode during which the switch protects the low noise amplifier from output signals output by the power amplifier. When the low noise amplifier is connected to the input/output pad by the switch, the transceiver front-end operates in the receive mode during which the switch allows input signals received by the antenna to be amplified by the low noise amplifier. The matching network can be operably connected to both the switch and the low noise amplifier in order to provide both impedance matching and electrostatic discharge protection for the switch and the low noise amplifier.

One specific embodiment of the transceiver front-end disclosed herein is design for integration into FDSOI technologies. This transceiver front-end can include an antenna, a transmitter branch and a receiver branch, which are all connected to an input/output pad. The transmitter branch can include a power amplifier and an impedance transformer. During the transmit mode, the power amplifier can generate output signals. The impedance transformer can couple the power amplifier to the input/output pad, thereby allowing the antenna to transmit the output signals. The receiver branch can include a low noise amplifier, a switch, and a matching network. In this case, the switch can specifically include multiple series-connected n-type FDSOI transistors. That is, the switch can include multiple series-connected, fully depleted, n-type field effect transistors on a relatively thin buried insulator layer above a semiconductor substrate. The switch can alternatively disconnect the low noise amplifier from the input/output pad or connect the low noise amplifier to the input/output pad. When the low noise amplifier is disconnected from the input/output pad by the switch, the transceiver front-end operates in the transmit mode during which the switch protects the low noise amplifier from output signals output by the transmitter branch. When the low noise amplifier is connected to the input/output pad by the switch, the transceiver front-end operates in the receive mode during which the switch allows input signals received by the antenna to be amplified by the low noise amplifier. The matching network can be operably connected to both the switch and the low noise amplifier in order to provide both impedance matching and electrostatic discharge protection for the switch and the low noise amplifier.

Another specific embodiment of the transceiver front-end disclosed herein is design for integration into finFET technologies. This transceiver front-end can include an antenna, a transmitter branch and a receiver branch, which are all connected to an input/output pad. The transmitter branch can include a power amplifier and an impedance transformer. During the transmit mode, the power amplifier can generate output signals. The impedance transformer can couple the power amplifier to the input/output pad, thereby allowing the antenna to transmit the output signals. The receiver branch can include a low noise amplifier, a switch, and a matching network. In this case, the switch can specifically include multiple series-connected n-type fin-type field effect transistors (finFETs) (e.g., on a bulk semiconductor substrate). The switch can alternatively disconnect the low noise amplifier from the input/output pad or connect the low noise amplifier to the input/output pad. When the low noise amplifier is disconnected from the input/output pad by the switch, the transceiver front-end operates in the transmit mode during which the switch protects the low noise amplifier from output signals output by the transmitter branch. When the low noise amplifier is connected to the input/output pad by the switch, the transceiver front-end operates in the receive mode during which the switch allows input signals received by the antenna to be amplified by the low noise amplifier. The matching network can be operably connected to both the switch and the low noise amplifier in order to provide both impedance matching and electrostatic discharge protection for the switch and the low noise amplifier.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

As mentioned above, a transceiver is a device that includes both a transmitter and a receiver, which share a common antenna or antenna array. The transceiver front-end refers to the circuitry within the transceiver from the antenna to and including a power amplifier in the transmitter branch and also to and including a low noise amplifier in the receiver branch.

Figure 1:
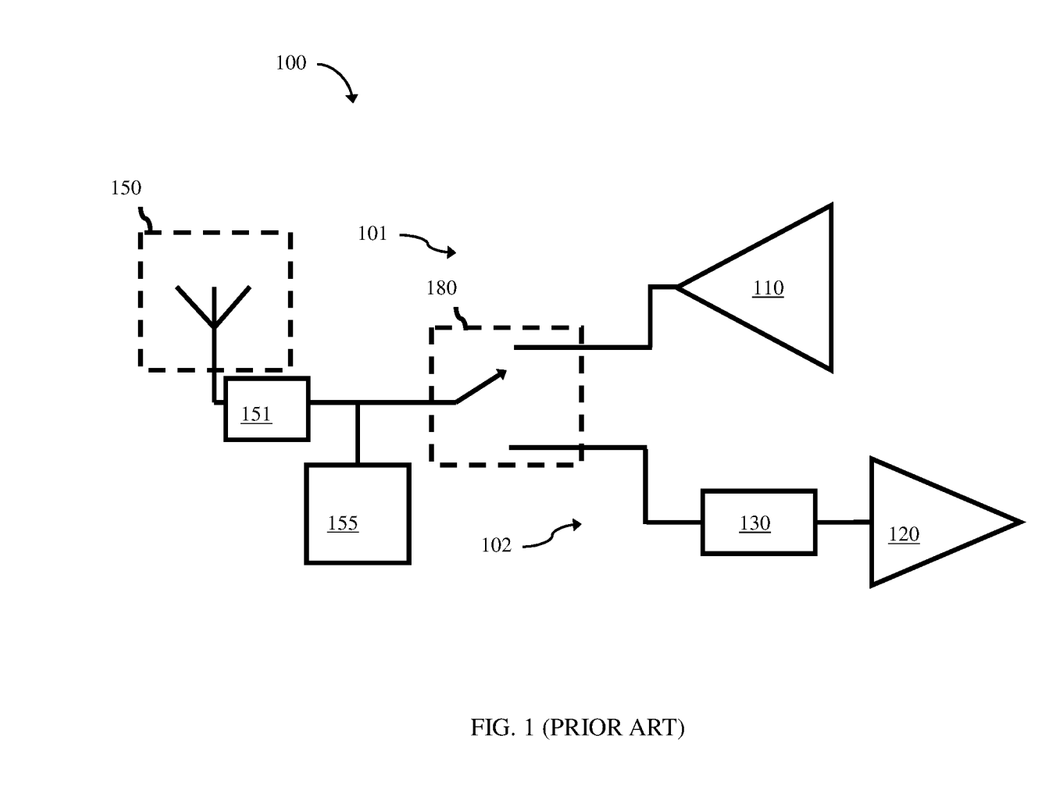
FIG. 1 is a schematic drawing illustrating a conventional transceiver front-end.

FIG. 1 is a schematic drawing illustrating a conventional architecture for a transceiver front-end 100. This transceiver front-end 100 includes an antenna 150, a transmitter branch 101 with a power amplifier 110 and a receiver branch 102 with a low noise amplifier 120. The antenna 150 is electrically connected to an input/output pad 151. A switch 180 selectively and alternatively electrically connects either the transmitter branch 101 or the receiver branch 102 to the input/output pad 151 and, thereby to the antenna 150. An electrostatic discharge (ESD) protection structure 155 (e.g., a shunt inductor or other ESD protection structure) is integrated into the transceiver front-end 100 between the input/output pad 151 and the switch 180 in order to protect the switch 180 and other components in the front-end. An impedance matching network 130 is typically integrated into the receiver branch 102 between the switch 180 and the low noise amplifier 120.

Those skilled in the art will recognize that the noise figure (NF) of a receiver refers to the difference in decibels (dB) between the noise output of an actual receiver to the noise output of an "ideal" receiver with the same overall gain and bandwidth when the receivers are connected to matched sources at the standard noise temperature. In other words the NF is a measure of the signal-to-noise degradation. For an optimal receiver performance gain stages of the receiver should have low NF values. Unfortunately, due to the ESD protection structure and the switch in combination with the low noise amplifier, the estimated noise figure (NF) for the receiver branch 102 in a transceiver front-end, which is configured as described above and illustrated in FIG. 1, can be relatively high. This is particularly notable at technology nodes that are optimized for fully depleted transistor formation. Specifically, with partially depleted transistors at least some ESD self-protection can be employed using their shunt branch. With fully depleted transistors (e.g., fully depleted fin-type field effect transistors (FD finFETs) or fully depleted silicon-on-insulator field effect transistors (FDSOI FETs), there is no shunt branch. In this case, the estimated noise figure (NF) for a 5G mmWave transceiver (e.g., a 30 GHz transceiver) can be approximately 3.8 dB (including 2 dB for the ESD structure and the switch and 1.8 dB for the low noise amplifier).

In view of the foregoing, disclosed herein are embodiments of a transceiver front-end configured for a reduced noise figure (NF). Generally, each of the embodiments disclosed herein includes an antenna, a transmitter branch and a receiver branch all connected to an input/output pad. The transmitter branch is coupled to the input/output pad (and thereby the antenna) by an impedance transformer. Only the receiver branch is selectively electrically connected to the input/output pad (and thereby the antenna) by a switch. A common matching network upstream of the switch provides both impedance matching and electrostatic discharge protection for the switch and the low noise amplifier, thereby reducing NF. Specific embodiments are also disclosed for integration into specific technologies (e.g., fully depleted silicon-on-insulator (FDSOI) technologies and fin-type field effect transistor (finFET) technologies). In any case, the transceiver front-end configuration has the added advantages of removing the switch from the transmitter branch (thereby avoiding power loss of output signals) and further avoiding the need for a negative bias on the switch when in the off-mode (i.e., when the transceiver is in the transmit mode).

Figure 2:
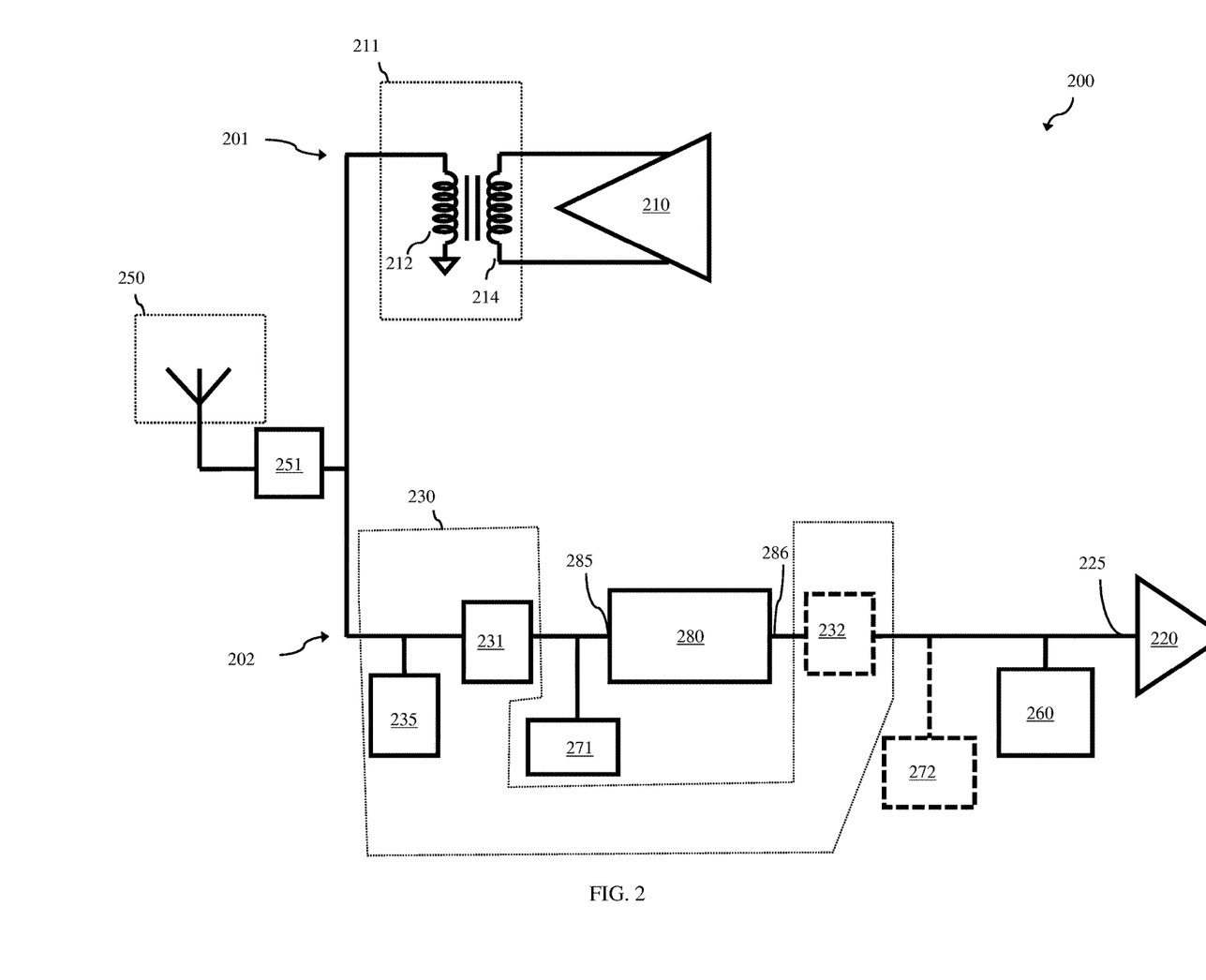
FIG. 2 is a schematic drawing illustrating generally embodiments of a transceiver front-end.
Figure 3A:
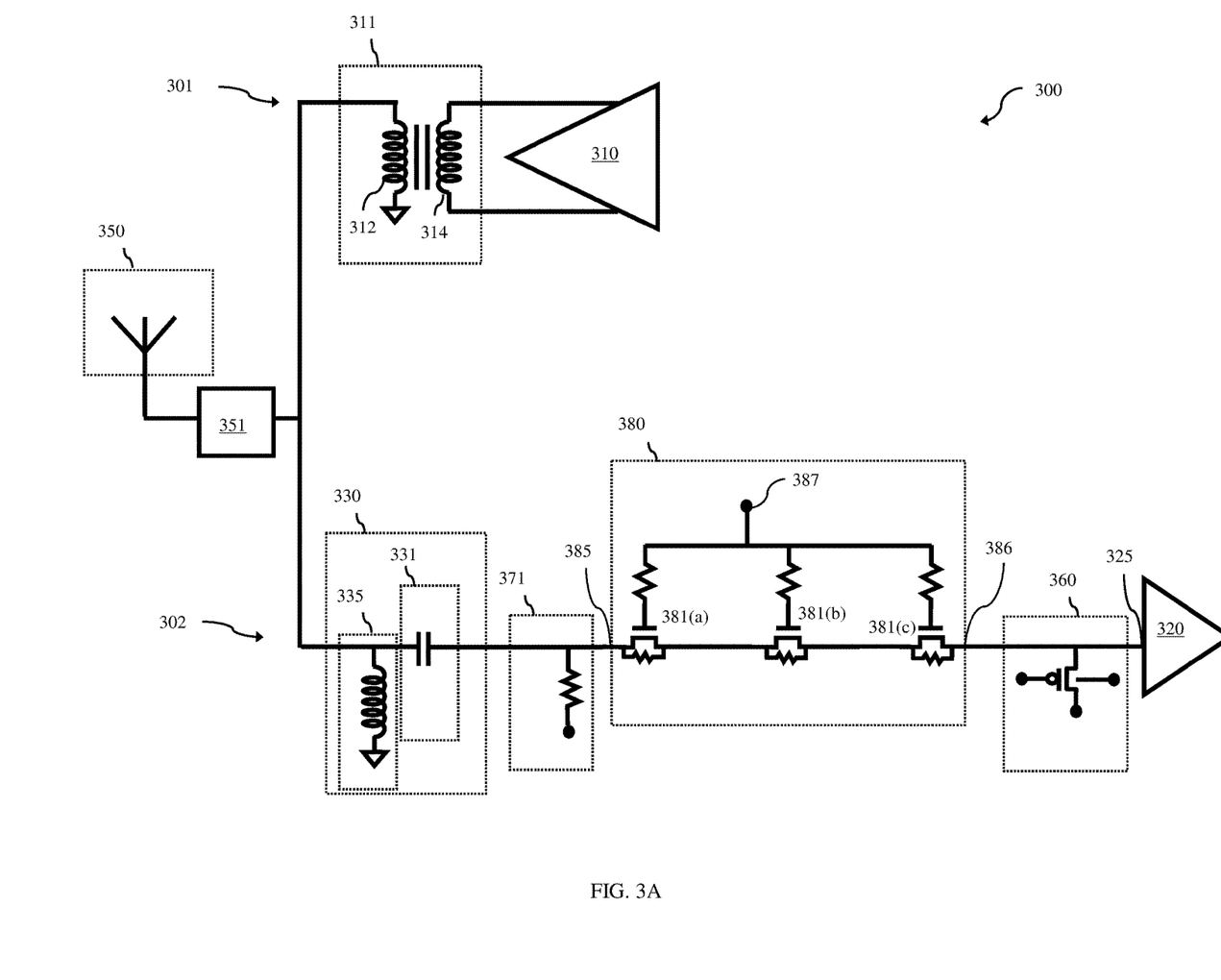
FIG. 3A is schematic drawing illustrating one embodiment of a transceiver front-end and FIGS. 3B and 3C are cross-section diagrams illustrating an exemplary switch and an exemplary shunt device, respectively, that could be incorporated into the transceiver front-end of FIG. 3A.
Figure 4A:
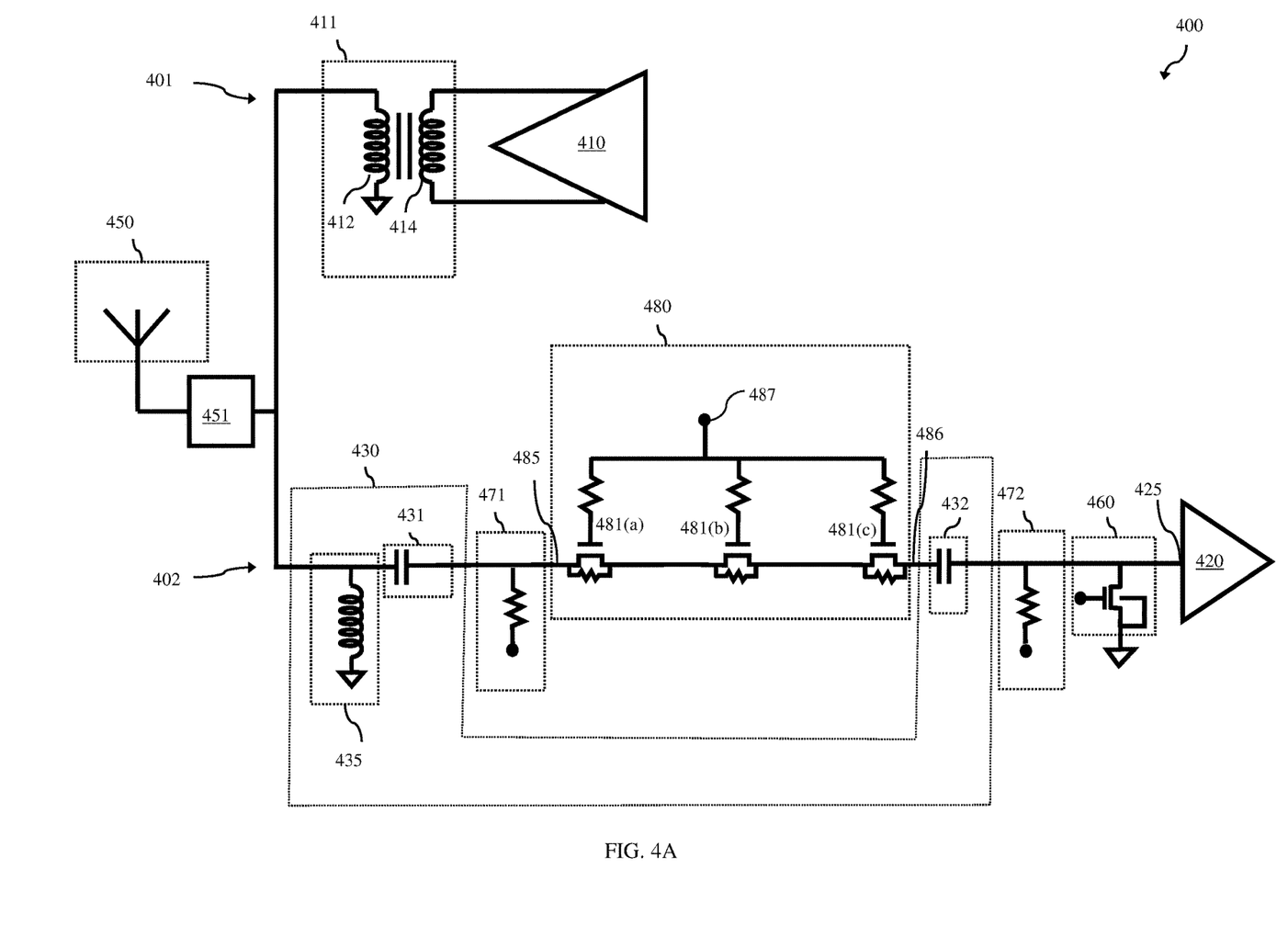
FIG. 4A is schematic drawing illustrating one embodiment of a transceiver front-end and FIGS. 4B and 4C are cross-section diagrams illustrating an exemplary switch and an exemplary shunt device, respectively, that could be incorporated into the transceiver front-end of FIG. 4A.

More particularly, FIG. 2 is a schematic diagram illustrating, generally, embodiments of a transceiver front-end 200 configured to have a reduced NF. FIG. 3A is a schematic diagram illustrating a specific embodiment of a transceiver front-end 300 configured to have a reduced NF and including specific features that enable integration into fully depleted silicon-on-insulator (FDSOI) technologies. FIG. 4A is a schematic diagram illustrating another specific embodiment of a transceiver front-end 400 configured to have a reduced NF and including specific features that enable integration into fin-type field effect transistor (finFET) technologies.

The transceiver front-end 200, 300, 400 can include: an antenna 250, 350, 450; a transmitter branch 201, 301, 401; and a receiver branch 202, 302, 402.

The antenna 250, 350, 450 can be a single antenna. Alternatively, the antenna 250, 350, 450 can be an antenna array that functions as a single antenna. Such antennas are well known in the art and, thus, the details thereof have been omitted from this specification in order to allow the reader to focus on the salient aspects of the disclosed embodiments. As mentioned above, a transceiver is a device that includes both a transmitter and a receiver, which share a common antenna or antenna array. The transceiver front-end refers to the circuitry within a transceiver from the antenna to and including a power amplifier in the transmitter branch and also to and including a low noise amplifier in the receiver branch. The transmitter branch refers to the portion of the transceiver front-end that is part of the transmitter and the receiver branch refers to the portion of the transceiver front-end that is part of the receiver. In any case, the antenna 250, 350, 450, the transmitter branch 201, 301, 401 and the receiver branch 202, 302, 402 can are all connected to an input/output pad 251, 351, 451.

The transmitter branch 201, 301, 401 can include a power amplifier 210, 310, 410 and an impedance transformer 211, 311, 411, which couples the power amplifier 210, 310, 410 to the input/output pad 251, 351, 451 and, thereby to the antenna 250, 350, 450. During the transmit mode, the power amplifier 210, 310, 410 can generate (i.e., can be adapted to generate, configured to generate, etc.) high power radio frequency (RF) output signals from low power RF output signals. In exemplary embodiments, the high power RF output signals can be millimeter wave (mmWave) RF output signals (i.e., between 24 GHz and 100 GHz, such as at 30 GHz) for 5G applications. Alternatively, the high power RF output signals can be RF signals in any other part of the radio spectrum. In exemplary embodiments, the power amplifier 210, 310, 410 can have an output voltage swing with a peak between 2.0 and 5 volts (e.g., at 2.5V, at 3V, at 3.5V, at 4V, etc.).

The impedance transformer 211, 311, 411 can include a pair of back-to-back inductors (i.e., a primary winding 214, 314, 414 and a secondary winding 212, 312, 412). During the transmit mode, the power amplifier 210, 310, 410 can apply the generated output signals to the primary winding 214, 314, 414. Due to inductive coupling, corresponding output signals will appear on the secondary winding 212, 312, 412 and will pass to the input/output pad 251, 351, 451 for subsequent transmission by the antenna 250, 350, 450. Depending upon the turns ratio between the two windings, the impedance transformer 211, 311, 411 provides impedance matching necessary between the output of the power amplifier 210, 310, 410 and the input of the antenna 250, 350, 450.

It should be noted that, as illustrated, there is no switch in the transmitter branch 201, 301, 401 between the power amplifier 210, 310, 410 and the input/output pad 251, 351, 451. That is, only the impedance transformer 211, 311, 411 is in line between the power amplifier 210, 310, 410. By eliminating the presence of a switch between the power amplifier 210, 310, 410, signal power degradation between the power amplifier 210, 310, 410 and the antenna 250, 350, 450 is minimized.

The receiver branch 202, 302, 402 can include: a switch 280, 380, 480; a low noise amplifier 220, 320, 420; a common impedance matching network 230, 330, 430; one or more bias resistors 271 (and optionally 272), 371, 471-472; and a shunt device 260, 360, 460.

The switch 280, 380, 480 can have an input terminal 285, 385, 485 and an output terminal 286, 386, 486. The switch 280, 380, 480 can be configured to (i.e., can be adapted to) selectively and alternatively disconnect the low noise amplifier 220, 320, 420 from the input/output pad 251, 351, 451 or connect the low noise amplifier 220, 320, 420 to the input/output pad 251, 351, 451. When the low noise amplifier 220, 320, 420 is disconnected from the input/output pad 251, 351, 451 by the switch 280, 380, 480, the transceiver front-end operates in the transmit mode during which the switch 280, 380, 480 protects the low noise amplifier 220, 320, 420 from output signals output by the transmitter branch. When the low noise amplifier 220, 320, 420 is connected to the input/output pad 251, 351, 451 by the switch 280, 380, 480, the transceiver front-end operates in the receive mode during which the switch 280, 380, 480 allows input signals received by the antenna to be amplified by the low noise amplifier 220, 320, 420.

Specifically, the switch 280, 380, 480 can selectively disconnect and, particularly, can be responsive to a control signal to selectively disconnect the low noise amplifier 220, 320, 420 from the input/output pad 251, 351, 451 when the transceiver front-end is operating in the transmit mode. By disconnecting the low noise amplifier 220, 320, 420 from the input/output pad 251, 351, 451 during the transmit mode, the switch 280, 380, 480 prevents high power and, particularly, high voltage output signals, which may pass from the transmitter branch 201, 301, 401 into the receiver branch 202, 302, 402, from ever reaching and damaging the low noise amplifier 220, 320, 420. The switch 280, 380, 480 can further selectively connect and, particularly, can be responsive to switching of the control signal in order to selectively connect the low noise amplifier 220, 320, 420 to the input/output pad 251, 351, 451 when the transceiver front-end is operating in the receive mode. By connecting the input/output pad 251, 351, 451 to the low noise amplifier 220, 320, 420 during the receive mode, the switch 280, 380, 480 allows input signals that have been received by the antenna 250, 350, 450 during the receive mode to be processed by the low noise amplifier 220, 320, 420.

In exemplary embodiments, the switch 280, 380, 480 can include multiple stacked n-type field effect transistors (NFETs) or, more particularly, multiple NFETs that are connected in series with the gates of all of the NFETs being connected to the same node and responsive to a control signal (i.e., an applied gate voltage) on that node to either turn on (e.g., in response to a relatively high applied gate voltage) or turn off (e.g., in response to a low applied gate voltage, such as being discharged to ground). It should be noted that the specific features of such a switch can vary depending upon the technologies used (see the detailed discussion below regarding the switch 380 in the receiver branch 302 of the transceiver front-end 300, see also the detailed discussion below regarding the switch 480 in the receiver branch 402 of the transceiver front-end 400).

Alternatively, any other suitable switch configuration could be employed. However, it should be noted that, regardless of the type of switch and the features the, the switch 280, 380, 480 should be configured so that it does not fail (e.g., does not turn from an off state to an on state) when subjected to the high voltage output signals from the power amplifier 210, 310, 410 during the transmit mode. For example, in the exemplary embodiments where the switch includes stacked NFETs, the sum of all maximum drain-source voltages (VDSs) for reliable operation of all of the NFETs in the switch should be greater than a maximum output voltage of the power amplifier in order to prevent the switch from failing during the transmit mode. In one example, if the power amplifier 210, 310, 410 has a maximum output voltage of 2 volts and if the NFETs each have a maximum VDS of 1.6 volts, then ideally the switch will have at least two stacked NFETs, which should be able to handle up 2 times 1.6 volts (i.e., 3.2 volts, which is greater than the 2V maximum output voltage of the power amplifier) applied to its input terminal during the transmit mode without failing. In another example, if the power amplifier 210, 310, 410 has a maximum output voltage of 3-4 volts and if the NFETs each have a maximum VDS of 1.6 volts, then ideally the switch will have at least three stacked NFETs, which should be able to handle up 3 times 1.6 volts (i.e., 4.8 volts, which is greater than the 3-4V maximum output voltage of the power amplifier) applied to its input terminal during the transmit mode without failing, and so on.

The low noise amplifier 220, 320, 420 of the receiver branch 202, 302, 402 can, during the receive mode, receive weak (i.e., low power) RF input signals through the switch 280, 380, 480 and can amplify (i.e., can be adapted to amplify, configured to amplify, etc.) those RF input signals in order to increase the power without increasing the noise present (i.e., without degrading the signal-to-noise ratio). Such low noise amplifiers 220, 320, 420 are well known in the art and, thus, the details have been omitted from this specification in order to allow the reader to focus on the salient aspects of the disclosed embodiments. During the transmit mode, the low noise amplifier 220, 320, 420 is shut down.

The common impedance matching network 230, 330, 430 of the receiver branch 202, 302, 402 can be operably connected to both the switch 280, 380, 480 and the low noise amplifier 220, 320, 420 in order to provide both impedance matching and electrostatic discharge (ESD) protection for the switch 280, 380, 480 and for the low noise amplifier. Specifically, the common impedance matching network 230, 330, 430 can include at least an inductor and a capacitor 231, 331, 431, which are electrically connected in series between ground and an input terminal 285, 385, 485 of the switch 280, 380, 480.

The inductor of the common impedance matching network 230, 330, 430 can be a discrete inductor 235, 335, 435, as illustrated, which is connected to the receiver branch 202, 302, 402 downstream of the input/output pad 251, 351, 451. Alternatively, the secondary winding 212, 312, 412 (i.e., the proximal inductor portion) of the impedance transformer 211, 311, 411 within the transmitter branch 201, 301, 401 could also function as the inductor of the common matching network during the receive mode. Dual-use of the secondary winding 212, 312, 412 is possible because there is no switch in the transmitter branch and, thus, the secondary winding 212, 312, 412 is an inductor that is directly connected in series between ground and the matching capacitor 231, 331, 431. In any case, the inductor of the common impedance matching network 230, 330, 430 can provide impedance matching to the low noise amplifier 220, 320, 420. The inductor can also provide electrostatic discharge (ESD) protection for the switch 280, 380, 480 and low noise amplifier 220, 320, 420.

The capacitor 231, 331, 431 of the common impedance matching network 230, 330, 430 can be connected in series between the inductor and the input terminal 285, 385, 485 of the switch 280, 380, 480 and can also be connected in series between input/output pad 251, 351, 451 and the input terminal 285, 385, 485 of the switch 280, 380, 480. The capacitor 231, 331, 431 can provide capacitance matching for the switch 280, 380, 480. It should be noted that this capacitor 231, 331, 431 also assists with biasing the input terminal 285, 385, 485 of the switch 280, 380, 480, thereby eliminating the need for applying a negative bias to the gate terminal of the switch 280, 380, 480 in the off state during the transmit mode.

It should be noted that, in some embodiments, the common impedance matching network may also include a second capacitor electrically connected to the output terminal of the switch. For example, see the optional second capacitor 232 in the common impedance matching network 230 of the transceiver front-end 200 of FIG. 2. See also the second capacitor 432 in the common impedance matching network 430 of the transceiver front-end 400 of FIG. 4A, which can be integrated into FDSOI technologies and which is discussed in greater detail below.

As mentioned above the receiver branch 202, 302, 402 can also include one or more bias resistors. For example, in each of the embodiments disclosed herein, the receiver branch 202, 302, 402 can include at least a first bias resistor 271, 371, 471 electrically connected to the input terminal 285, 385, 485 of the switch 280, 380, 480, thereby enabling different first bias voltages to be applied to the input terminal 285, 385, 485 of the switch 280, 380, 480 during the transmit mode and the receive mode, respectively. In some of the embodiments disclosed herein, the receiver branch can also include a second bias resistor. For example, see the optional second bias resistor 272 in receiver branch 202 of the transceiver front-end 200 shown in FIG. 2. See also the second bias resistor 472 in the receiver branch 402 of the transceiver front-end 400 shown in FIG. 4A, which can be integrated into FDSOI technologies and which is discussed in greater detail below. Such a second bias resistor 272, 472 can be electrically connected to the input terminal 225, 425 of the low noise amplifier 220, 420, thereby enabling second bias voltage(s) to be applied to the input terminal of the low noise amplifier during the transmit mode and/or the receive mode.

The shunt device 260, 360, 460 can be integrated into the receiver branch downstream of the switch 280, 380, 480 and upstream of the low noise amplifier 220, 320, 420 (i.e., between the switch and the low nose amplifier). The shunt device 260, 360, 460 can have an on state, which occurs whenever the transceiver front-end 200, 300, 400 is in the transmit mode, and an off state, which occurs whenever the transceiver front-end 200, 300, 400 is in the receive mode. The shunt device 260, 360, 460 can be configured so that, when it is turned on during the transmit mode, it provides a low resistance path for current to flow. Thus, if the switch 280, 380, 480, which is should be in the off state during the transmit mode, allows current to pass there through, the current will be shunted through the shunt device 260, 360, 460 bypassing the low noise amplifier 220, 320, 420 and preventing the low noise amplifier from being damaged. Specifically, the shunt device 260, 360, 460 provides low-impedance for the large signal at the input of the ESD and hence kills the large swing at the LNA input. Note that the LNAs are shut-down by cascode devices (not shown in figures). The shunt device 260, 360, 460 can further be configured so that, when it is turned off during the receive mode, current that passes through the switch is not shunted away but instead is allowed pass into the input terminal 225, 325, 425 of the low noise amplifier 220, 320, 420 for processing. The shunt device 260, 360, 460 can be, for example, single field effect transistor. It should be noted that the specific features of such the shunt device can vary depending upon the technologies used (see the detailed discussion below regarding the shunt device 360 in the receiver branch 302 of the transceiver front-end 300, see also the detailed discussion below regarding the shunt device 460 in the receiver branch 402 of the transceiver front-end 400).

Figure 3B:
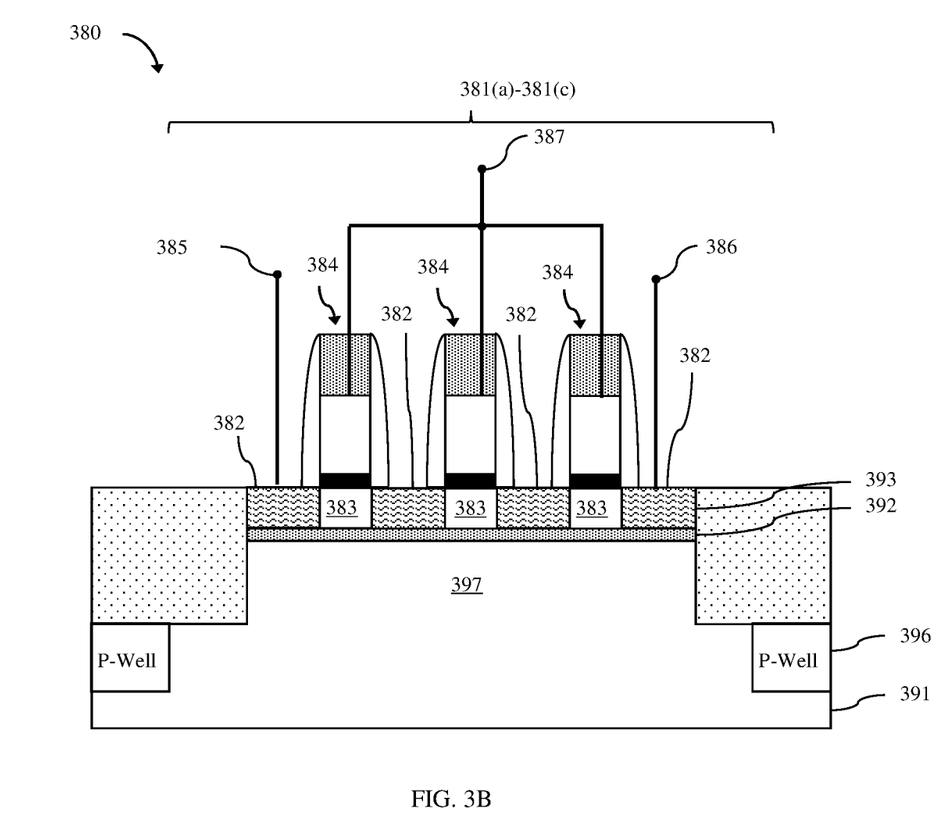
Figure 3C:
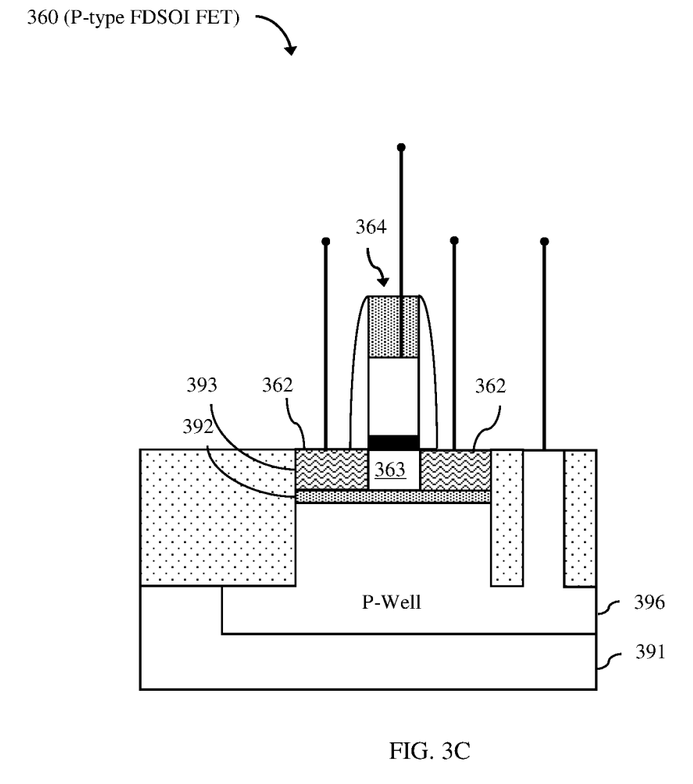

As mentioned above, FIG. 3A is a schematic diagram illustrating a specific embodiment of a transceiver front-end 300 configured to have a reduced NF and including specific features that enable integration into fully depleted silicon-on-insulator (FDSOI) technologies. FIG. 3B is a cross-section diagram illustrating an exemplary switch 380 that can be incorporated into this transceiver front-end 300 and FIG. 3C is a cross-section diagram illustrating an exemplary shunt device 360 that can be incorporated into the transceiver front-end 300.

Those skilled in the art will recognize that FDSOI technology employs a silicon-on-insulator wafer having an ultra thin silicon layer (e.g., a silicon layer with a thickness of 25 nm or less, for example, 22 nm, 12 nm, etc.) on a thin buried insulator layer (e.g., a thin buried oxide layer) over a semiconductor substrate. The ultra thin silicon layer is used to form fully depleted planar field effect transistors. Optionally, well regions can be formed in the semiconductor substrate aligned below the transistors and these well regions can be contacted so that, in combination with the buried insulator layer, back gates are formed.

As discussed above, the transceiver front-end 300 can include an antenna 350, a transmitter branch 301 and a receiver branch 302 all connected to an input/output pad 351.

The transmitter branch 301 can include a power amplifier 310 coupled by an impedance transformer 311 to the input/output pad 351 and, thereby to the antenna 350. In exemplary embodiments, the power amplifier 310 can have an output voltage swing with a peak between 2.0 and 5 volts (e.g., at 2.5V, at 3V, at 3.5V, at 4V, etc.).

The receiver branch 302 can include: a low noise amplifier 320 connectable by a switch 380 to the input/output pad 351; a common impedance matching network 330 with an inductor and single capacitor 331 connected in series between ground and the input terminal 385 of the switch 380; a single bias resistor 371 connected to the input terminal 385 of the switch 380; and a shunt device 360 connected downstream of the switch 380 and upstream from the low noise amplifier 320.

As mentioned above, the inductor of the common impedance matching network 330 can be a discrete inductor 335. Alternatively, the secondary winding 312 of the impedance transformer 311 can serve dual-function as the inductor for the common impedance matching network.

In this embodiment, the switch 380 can include planar, series-connected FDSOI NFETs 381(a)-381(c) (e.g., as shown in FIG. 3B), which are configured to selectively disconnect the low noise amplifier 320 from the input/output pad 351 during the transmit mode and to selectively connect the low noise amplifier 320 to the input/output pad 351 during the receive mode. Each FDSOI NFET 381(a)-381(c) can include, within a thin semiconductor layer 393 (e.g., a thin silicon layer) above a buried insulator layer 392 (e.g., a buried oxide layer), N+ source/drain regions 382 and a channel region 383 (e.g., an undoped channel region) positioned laterally between the N+ source/drain regions 382. As illustrated, adjacent NFETs can share a source/drain region so as to provide the series connection. The NFETs 381(a)-381(c) can further include gate structures 384 (each including a gate dielectric layer and a gate conductor layer) on the top surface of the thin silicon layer 393 above the channel regions 383, respectively. These gate structures 384 can be electrically connected at a common gate node 387. In order to minimize parasitic capacitance, the FDSOI NFETs 381(a)-381(c) of the switch 380 can be BFMOAT FDSOI NFETs. That is, oftentimes, during FDSOI NFET manufacturing, a dopant implantation process is performed in order to form one or more P-wells (i.e., P+ doped regions) in the semiconductor substrate aligned below one or more FDSOI FETs. Such P-wells can, optionally, be contacted and in combination with the buried insulator layer can function as back gates. However, the presence of a P-well can cause an increase in parasitic capacitance. To avoid this parasitic capacitance BFMOAT FDSOI FETs can be formed. "BFMOAT" refers to a masking level performed during manufacturing to block dopant implantation so that no P-well is formed in a desired region of the semiconductor substrate, thereby making that region a high resistance region. So, as illustrated in FIG. 3B, a high resistance region 397 (i.e., a a region devoid of a P-well) is within the semiconductor substrate 391 aligned below the FDSOI NFETs 381(a)-381(c) and a P-well ring region 396 borders (i.e., encircles) the high resistance region 397.

It should be noted that, for purposes of illustration, the switch 380 is described above as including three series-connected NFETs 381(a)-381(c). However, it should be understood that the figures and the exemplary embodiments described are not intended to be limiting. Alternatively, any number of one or more BFMOAT FDSOI NFETs could be employed to form the switch 380 as long as the combined maximum VDS of all NFETs in the switch 380 is sufficient to ensure that switch 380 will not fail during the transmit mode if/when the maximum output voltage of the power amplifier 310 is applied at the input terminal 385 of the switch 380. In one example, if the power amplifier 310 has a maximum output voltage of 2 volts and if the NFETs each have a maximum VDS of 1.6 volts, then ideally the switch 380 will have at least two stacked NFETs, which should be able to handle up 2 times 1.6 volts (i.e., 3.2 volts, which is greater than the 2V maximum output voltage of the power amplifier) applied to its input terminal during the transmit mode without failing. In another example, if the power amplifier 310 has a maximum output voltage of 3-4 volts and if the NFETs each have a maximum VDS of 1.6 volts, then ideally the switch will have at least three stacked NFETs, which should be able to handle up 3 times 1.6 volts (i.e., 4.8 volts, which is greater than the 3-4V maximum output voltage of the power amplifier) applied to its input terminal during the transmit mode without failing, and so on.

In this embodiment, the shunt device 360 can be a super low threshold voltage (SLVT) FDSOI PFET, which is integrated into the receiver branch 302 downstream of the switch 380 and upstream of the low noise amplifier 320. The PFET shunt device 360 can have an on state that occurs whenever the transceiver front-end 300 is in the transmit mode and an off state that occurs whenever the transceiver front-end 300 is in the receive mode. As shown in FIG. 3C, an exemplary PFET shunt device 360 that could be incorporated into the receiver branch 302 could include, within a thin silicon layer 393 above a buried insulator layer 392 (e.g., a buried oxide layer), P+ source/drain regions 362 and a channel region 363 (e.g., an undoped channel region) positioned laterally between the P+ source/drain regions 362. The PFET shunt device 360 can include a gate structure 364 (including a gate dielectric layer and a gate conductor layer) on the top surface of the thin silicon layer 393 above the channel region 363 and can also include a P-well ring region 396 within the semiconductor substrate 391 and bordering (i.e., encircling) the high resistance region 397. The P-well ring region 396 can be contacted and in combination with the buried insulator layer 392 can function as a back gate.

Such a transceiver front-end 300 can operate as follows in the transmit and receive modes.

During the transmit mode, in the transmit branch 301, the power amplifier 310 can be turned on and can output high power output signals via the impedance transformer 311 to the input/output pad 351 and thereby to the antenna 350. During the transmit mode, in the receiver branch 302, the NFETs 381(a)-381(c) of the switch 380 and the low noise amplifier 320 can be turned off and the PFET shunt device 360 can be turned on. This can be achieved by applying 0.0V to the common gate node 387 for the switch 380 and to the front gate and, optionally, the back gate of the PFET shunt device 360. Additional biasing conditions in the receiver branch 302 during the transmit mode can include applying a positive bias voltage (VBIAS) (e.g., 0.8V) to the input terminal 385 of the switch 380 through the bias resistor 371 and applying this same first positive bias voltage to the drain region of the PFET shunt device 360. As a result, the voltage level at the input terminal 325 of the low noise amplifier 320 will be at 0.8V but the low noise amplifier can still be turned off using the cascade bias voltage. It should be noted that the impedance transformer 311 in the transmitter branch 301 and the common impedance matching network 330 in the receiver branch 302 should be co-designed with the input impedance to the receiver branch (Zin_rx) during the transmit mode in mind. Additionally, it should be noted that during the transmit mode the output voltage from the power amplifier 310 will be applied to the receiver branch 302 and, particularly, the capacitor 331 of the common impedance matching network, where it will be only slightly amplified (e.g., by approximately 10 percent) before reaching the input terminal 385 of the switch 380. The swing will, however, be completely attenuated at the output terminal 386.

During the receive mode in the transmitter branch 301, the power amplifier 310 is turned off (e.g., the power amplifier voltage supply is set to ground and power amplifier bias in on). It should be noted that the impedance transformer 311 in the transmitter branch 301 and the common impedance matching network 330 in the receiver branch 302 should also be co-designed with the input impedance to the transmitter branch (Zin_tx) during the receive mode in mind and, particularly, so that Zin-tx does not affect the receiver NF. Zin-tx can, for example, be in the form of a large inductor (i.e., an inductor larger than the inductor 335) connected in parallel with a larger resistor (e.g., a resistor with several 100 Ohms) (not shown). During the receive mode in the receiver branch 302, the NFETs 381(a)-381(c) of the switch 380 and the low noise amplifier 320 can be turned on and the PFET shunt device 360 can be turned off. To turn on the switch 380, a high gate voltage (VGG) can be applied to the common gate node 387 for the switch 380. VGG can be equal the optimal input voltage (VG0) for the low noise amplifier plus the positive bias voltage (VBIAS) (e.g., 0.8V) or some higher positive bias voltage (VBIAS+) (e.g., 1.0V). Those skilled in the art will recognize that the optimal input voltage (VG0) for the low noise amplifier may vary depending upon the technology node. For example, for 22 nm FDSOI, this optimal input voltage could be 0.3-0.4V. Thus, VGG could be equal to 1.2V or higher. To turn the PFET shunt device 360 off, a high positive supply voltage (VDD) can be applied to the front gate and, optionally, the back gate. Additional biasing conditions in the receiver branch 302 during the receive mode can include applying VDD to the drain region of the PFET shunt device 360 and applying a lower positive bias voltage (VBIAS−) to the input terminal 385 of the switch 380 through the bias resistor 371. VBIAS− can be equal to the optimal input voltage (VG0) for the low noise amplifier (discussed above). It should be noted that there is no back gate biasing of the BFMOAT FDSOI NFETs due to the high resistance region 397.

Figure 4B:
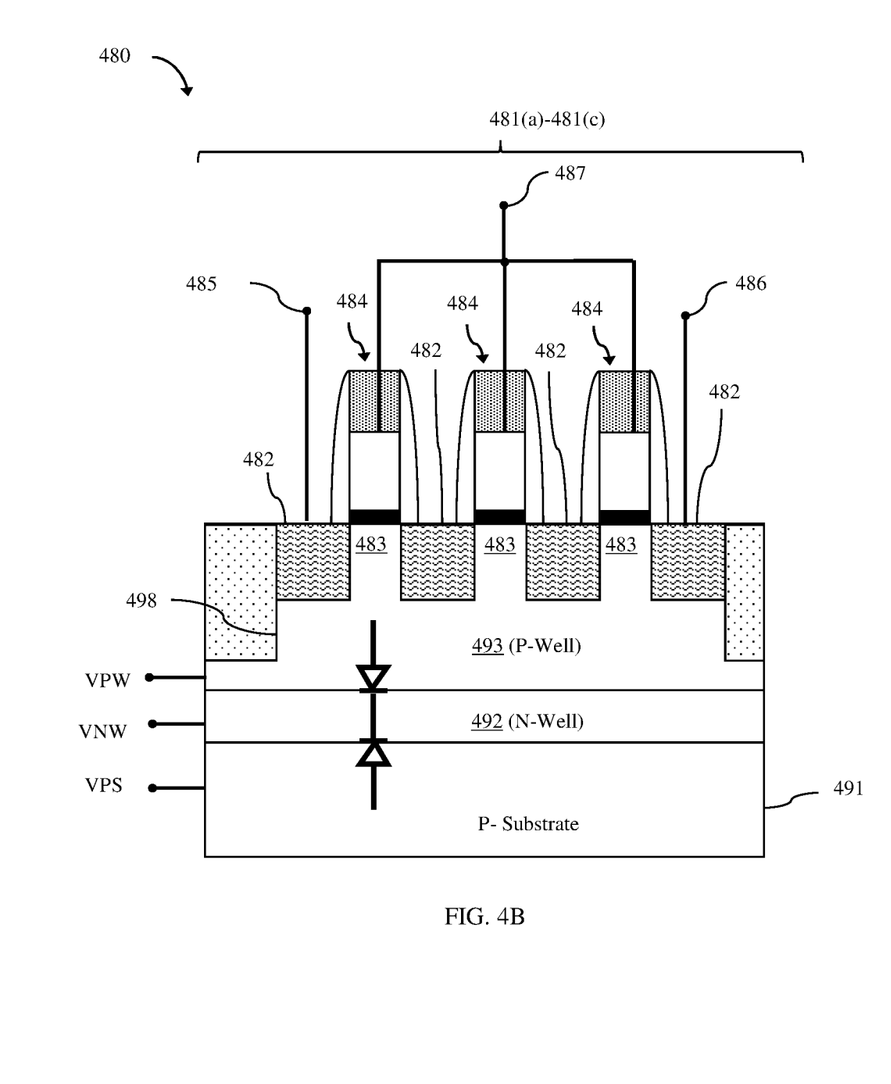
Figure 4C:
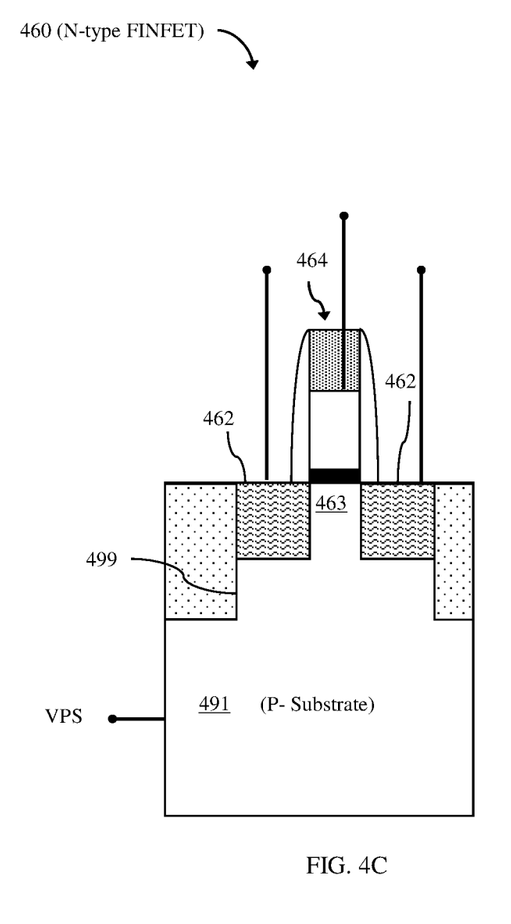

As mentioned above, FIG. 4A is a schematic diagram illustrating a specific embodiment of a transceiver front-end 400 configured to have a reduced NF and including specific features that enable integration into bulk fin-type field effect transistor (finFET) technologies. FIG. 4B is a cross-section diagram illustrating an exemplary switch 480 that can be incorporated into this transceiver front-end 400 and FIG. 4C is a cross-section diagram illustrating an exemplary shunt device 460 that can be incorporated into the transceiver front-end 400.

Those skilled in the art will recognize that bulk finFET technologies employ a bulk semiconductor substrate (e.g., a bulk silicon substrate). One or more semiconductor fins (i.e., one or more elongated, relatively tall and thin, essentially rectangular-shaped, semiconductor bodies) are patterned into the upper portion of the substrate. Within each semiconductor fin, a channel region is positioned laterally between source/drain regions. A gate structure is positioned adjacent to the top surface and opposing sidewalls of the semiconductor fin at the corresponding channel region, respectively. Such a finFET is a fully depleted structure that exhibits multi-dimensional field effects as compared to the single-dimensional field effects exhibited by a planar FET and, thus, exhibits improved gate control over the channel region. Isolation from the lower portion of the semiconductor substrate is provided by one or more doped well regions. Optionally, multiple semiconductor fins can be incorporated into a single finFET to increase drive strength.

As discussed above, the transceiver front-end 400 can include an antenna 450, a transmitter branch 401 and a receiver branch 402 all connected to an input/output pad 451.

The transmitter branch 401 can include a power amplifier 410 coupled by an impedance transformer 411 to the input/output pad 451 and, thereby to the antenna 450. In exemplary embodiments, the power amplifier 410 can have an output voltage swing with a peak between 2.0 and 5 volts (e.g., at 2.5V, at 3V, at 3.5V, at 4V, etc.).

The receiver branch 402 can include: a low noise amplifier 420 connectable by a switch 480 to the input/output pad 451; a common impedance matching network 430 with an inductor and a first capacitor 431 connected in series between ground and the input terminal 485 of the switch 480 and with a second capacitor 432 connected to the output terminal 486 of the switch 480; a first bias resistor 471 connected to the input terminal 485 of the switch 480 and a second bias resistor 472 connected to the input terminal 425 of the low noise amplifier 420; and a shunt device 460 connected downstream of the switch 480 and upstream from the low noise amplifier 420.

As mentioned above, the inductor of the common impedance matching network 430 can be a discrete inductor 435. Alternatively, the secondary winding 412 of the impedance transformer 411 can serve dual-function as the inductor for the common impedance matching network. It should be noted that the second capacitor 432 is required to provide isolation between output terminal 486 of the switch 480 and the second bias resistor 472.

In this embodiment, the switch 480 can include series-connected N-type finFETs 481(a)-481(c) (e.g., as shown in FIG. 4B), which are configured to selectively disconnect the low noise amplifier 420 from the input/output pad 451 during the transmit mode and to selectively connect the low noise amplifier 420 to the input/output pad 451 during the receive mode. The NFETs 481(a)-481(c) can be formed, for example, a semiconductor fin 499 patterned into the upper portion of a P− semiconductor substrate 491. The semiconductor fin 499 can include, for each NFET, N+ source/drain regions 482 and a P− channel region 483 positioned laterally between the N+ source/drain regions 482. As illustrated, adjacent NFETs can share a source/drain region so as to provide the series connection. The NFETs 481(a)-481(c) can further include gate structures 484 (each including a gate dielectric layer and a gate conductor layer) on the top surface and opposing sidewalls of the semiconductor fin 499 adjacent to the channel regions 483, respectively. It should be noted that multiple semiconductor fins can be incorporated into the NFETs of the switch for improved drive strength. In any case, these gate structures 484 can be electrically connected at a common gate node 487. The NFETs 481(a)-481(c) can be "triple well" NFETs. That is, a P-well 493 can be in the P− semiconductor substrate 491 below the NFETs and an N-well 492 can be in the P− semiconductor substrate 491 between the P-well 493 and a P− area (which is between the N-well 492 and the bottom surface of the substrate 491).

It should be noted that, for purposes of illustration, the switch 480 is described above as including three series-connected NFETs 481(a)-481(c). However, it should be understood that the figures and the exemplary embodiments described are not intended to be limiting. Alternatively, any number of one or more triple well N-type finFETs could be employed to form the switch 480 as long as the combined maximum VDSs of all NFETs in the switch 480 is sufficient to ensure that switch 480 will not fail in the off-state during the transmit mode if/when the maximum output voltage of the power amplifier 410 is applied at the input terminal 485 of the switch 480. In one example, if the power amplifier 410 has a maximum output voltage of 2 volts and if the NFETs each have a maximum VDS of 1.6 volts, then ideally the switch 480 will have at least two stacked NFETs, which should be able to handle up 2 times 1.6 volts (i.e., 3.2 volts, which is greater than the 2V maximum output voltage of the power amplifier) applied to its input terminal during the transmit mode without failing. In another example, if the power amplifier 410 has a maximum output voltage of 3-4 volts and if the NFETs each have a maximum VDS of 1.6 volts, then ideally the switch 480 will have at least three stacked NFETs, which should be able to handle up 3 times 1.6 volts (i.e., 4.8 volts, which is greater than the 3-4V maximum output voltage of the power amplifier) applied to its input terminal during the transmit mode without failing, and so on.

In this embodiment, the shunt device 460 can be an N-type finFET, which is integrated into the receiver branch 402 downstream of the switch 480, second capacitor 432 and second bias resistor 472 and upstream of the low noise amplifier 420. This NFET shunt device 460 can have an on state that occurs whenever the transceiver front-end 400 is in the transmit mode and can have an off state that occurs whenever the transceiver front-end 400 is in the receive mode. As shown in FIG. 4C, an exemplary PFET shunt device 460 that could be incorporated into the receiver branch 402 can include, within a semiconductor fin 498 (e.g., a silicon fin) patterned into the upper portion of a P− semiconductor substrate, N+ source/drain regions 462 and P− channel region 463 positioned laterally between the N+ source/drain regions 462. The NFET shunt device 460 can further include a gate structure 464 (including a gate dielectric layer and a gate conductor layer) adjacent to the top surface and opposing sides of the semiconductor fin 498 at the channel region 463. It should be noted that multiple semiconductor fins could be incorporated into the PFET of the shunt device 460 for improved drive strength.

Such a transceiver front-end 400 can operate as follows in the transmit and receive modes.

During the transmit mode, in the transmit branch 401, the power amplifier 410 can be turned on and can output high power output signals via the impedance transformer 411 to the input/output pad 451 and thereby to the antenna 450. During the transmit mode, in the receiver branch 402, the NFETs 481(a)-481(c) of the switch 480 and the low noise amplifier 420 can be turned off and the NFET shunt device 460 can be turned on. This can be achieved by applying 0.0V to the common gate node 487 for the switch 480 and a first positive bias voltage (e.g., 0.8V) to the gate of the NFET shunt device 460. Turning on the NFET shunt device 460 pulls down the voltage level at the input terminal of the low noise amplifier 420 completely shutting it down. Additional biasing conditions in the receiver branch 402 during the transmit mode can include applying the same first positive bias voltage (VBIAS1) (e.g., 0.8V) to the input terminal 485 of the switch 480 through the first bias resistor 471 and applying 0.0V to the input terminal 425 of the low noise amplifier 420 through the second bias resistor 472. It should be noted that the impedance transformer 411 in the transmitter branch 401 and the common impedance matching network 430 in the receiver branch 402 should be co-designed with the input impedance to the receiver branch (Zin_rx) during the transmit mode in mind. Additionally, it should be noted that during the transmit mode the output voltage from the power amplifier 410 will be applied to the receiver branch 402 and, particularly, the first capacitor 431 of the common impedance matching network 430, where it will be only slightly amplified (e.g., by approximately 10 percent) before reaching the input terminal 485 of the switch 480. The swing will, however, be completely attenuated at the output terminal 486.

During the receive mode in the transmitter branch 401, the power amplifier 410 is turned off (e.g., the power amplifier voltage supply is set to ground and power amplifier bias in on). It should be noted that the impedance transformer 411 in the transmitter branch 401 and the common impedance matching network 430 in the receiver branch 402 should also be co-designed with the input impedance to the transmitter branch (Zin_tx) during the receive mode in mind and, particularly, so that Zin-tx does not affect the receiver NF. Zin-tx can, for example, be in the form of a large inductor (i.e., an inductor larger than the inductor 435) connected in parallel with a larger resistor (e.g., a resistor with several 100 Ohms) (not shown).

During the receive mode in the receiver branch 402, the NFETs 481(a)-481(c) of the switch 480 and the low noise amplifier 420 can be turned on and the NFET shunt device 460 can be turned off. To turn on the switch 480, a high gate voltage (VGG) can be applied to the common gate node 487 for the switch 480. VGG can be equal a somewhat higher positive bias voltage (VBIAS+) (e.g., 1.0V or more). For example, VGG can be equal to the optimal input voltage (VG0) (e.g., 0.3-0.4V) for the low noise amplifier plus the positive bias voltage (VBIAS) (e.g., 0.8V). That is, VGG could be equal to 1.2V or higher. To turn the NFET shunt device 460 off, the gate is discharged to ground. Additional biasing conditions in the receiver branch 402 during the receive mode can include, for example for 20 dBm power handling, applying the positive bias voltage (VBIAS) (e.g., 0.8V) to the input terminal 485 of the switch 480 through the first bias resistor 471, applying a zero voltage (VPW) to the P-well 493 below the NFETs 481(a)-481(c) (e.g., discharging the P-well 493 to ground) and applying a significantly higher positive voltage (VNW, e.g., 2.5V) to the N-well 492 that is below the P-well and above the P− substrate 491. Additionally, a lower positive bias voltage (VBIAS−) can be applied to the input terminal 425 of the low noise amplifier 420 through the second bias resistor 472. VBIAS− can be equal to the optimal input voltage (VG0) for the low noise amplifier (discussed above).

Therefore, disclosed above are embodiments of a transceiver front-end configured for a reduced noise figure (NF). Generally, each of the embodiments includes an antenna, a transmitter branch and a receiver branch all connected to an input/output pad. The transmitter branch is coupled to the input/output pad (and thereby the antenna) by an impedance transformer. Only the receiver branch is selectively electrically connected to the input/output pad (and thereby the antenna) by a switch. A common matching network upstream of the switch provides both impedance matching and electrostatic discharge protection for the switch and the low noise amplifier, thereby reducing NF. Specific embodiments are also disclosed for integration into different technologies (e.g., fully depleted silicon-on-insulator (FDSOI) technologies and fin-type field effect transistor (finFET) technologies). In any case, the transceiver front-end configuration has the added advantages of removing the switch from the transmitter branch (thereby avoiding power loss of output signals) and further avoiding the need for a negative bias on the switch when in the off-mode (i.e., when the transceiver is in the transmit mode).

It should be understood that in the structures described above, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and gallium nitride-based semiconductor materials. A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P− type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity or silicon (Si) to achieve N-type conductivity. Those skilled in the art will also recognize that different conductivity levels will depend upon the relative concentration levels of the dopant(s) in a given semiconductor region.

Additionally, it should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A transceiver front-end comprising:
an antenna;
a transmitter branch; and
a receiver branch, wherein the antenna, the transmitter branch and the receiver branch are connected to an input/output pad, wherein the transceiver front-end is operable in a transmit mode and a receive mode, and wherein the receiver branch comprises:
a low noise amplifier;
a switch,
wherein the switch alternatively disconnects the low noise amplifier from the input/output pad and connects the low noise amplifier to the input/output pad, wherein, when the low noise amplifier is disconnected from the input/output pad by the switch, the transceiver front-end operates in the transmit mode, wherein, when the low noise amplifier is connected to the input/output pad by the switch, the transceiver front-end operates in the receive mode, and wherein, when the transceiver front-end is in the receive mode, the low noise amplifier amplifies input signals received by the antenna; and a matching network within the receiver branch between the input/output pad and the low noise amplifier and operably connected to the switch and the low noise amplifier, wherein the matching network provides both impedance matching and electrostatic discharge protection for the switch and the low noise amplifier.

2. The transceiver front-end of claim 1, wherein the transmitter branch comprises a power amplifier that, during the transmit mode, generates output signals and wherein the transmitter branch further comprises an impedance transformer that couples the power amplifier to the input/output pad allowing the antenna to transmit the output signals, and wherein the switch comprises series-connected n-type field effect transistors and wherein a sum of all drain-source voltages of the series-connected n-type field effect transistors in the switch is greater than a maximum output voltage of the power amplifier to prevent the switch from turning on during the transmit mode.

3. The transceiver front-end of claim 1, wherein the matching network comprises: an inductor and a capacitor electrically connected in series between ground and an input terminal of the switch, and wherein the receiver branch further comprises a bias resistor electrically connected to an input terminal of the switch enabling different bias voltages to be applied to the input terminal of the switch during the transmit mode and the receive mode, respectively.

4. The transceiver front-end of claim 3, wherein the receiver branch further comprises a second bias resistor electrically connected to an input terminal of the low noise amplifier, and wherein the matching network further comprises a second capacitor electrically connected to between an output terminal of the switch and the second bias resistor.

5. The transceiver front-end of claim 1, wherein the receiver branch further comprises a shunt device downstream of the switch and upstream of the low noise amplifier, and wherein the shunt device is in an off state during the receive mode and in an on state during the transmit mode.

6. A transceiver front-end comprising:

an antenna;

a transmitter branch; and a receiver branch, wherein the antenna, the transmitter branch and the receiver branch are connected to an input/output pad, wherein the transceiver front-end is operable in a transmit mode and a receive mode, and wherein the receiver branch comprises:

a low noise amplifier;

a switch, wherein the switch comprises fully depleted, planar, series-connected n-type field effect transistors on a buried insulator layer above a semiconductor substrate, wherein the switch alternatively disconnects the low noise amplifier from the input/output pad connects the low noise amplifier to the input/output pad, wherein, when the low noise amplifier is disconnected from the input/output pad by the switch, the transceiver front-end operates in a transmit mode, wherein, when the low noise amplifier is connected to the input/output pad by the switch, the transceiver front-end operates in a receive mode, and wherein, when the transceiver front-end is in the receive mode, the low noise amplifier amplifies input signals received by the antenna; and a matching network within the receiver branch between the input/output pad and the low noise amplifier and operably connected to the switch and the low noise amplifier, wherein the matching network provides both impedance matching and electrostatic discharge protection for the switch and the low noise amplifier.

7. The transceiver front-end of claim 6, wherein the transmitter branch comprises a power amplifier that, during the transmit mode, generates output signals and wherein the transmitter branch further comprises an impedance transformer that couples the power amplifier to the input/output pad allowing the antenna to transmit the output signals, and wherein a sum of all drain-source voltages of all n-type field effect transistors in the switch is greater than a maximum output voltage of the power amplifier to prevent the switch from turning on during the transmit mode.

8. The transceiver front-end of claim 6, wherein a region of the semiconductor substrate aligned below the switch is a high resistance region.

9. The transceiver front-end of claim 6, wherein the matching network comprises: an inductor and a capacitor electrically connected in series between ground and an input terminal of the switch.

10. The transceiver front-end of claim 6, wherein the receiver branch further comprises a bias resistor electrically connected to an input terminal of the switch enabling different bias voltages to be applied to the input terminal of the switch during the transmit mode and the receive mode, respectively.

11. The transceiver front-end of claim 10, wherein a positive bias voltage applied to the input terminal of the switch during the receive mode is equal to an optimal input voltage for the low noise amplifier, and wherein a positive bias voltage applied to the input terminal of the switch during the transmit mode is greater than the positive bias voltage applied during the receive mode.

12. The transceiver front-end of claim 11, the receiver branch further comprising a shunt device downstream of the switch and upstream of the low noise amplifier, wherein the shunt device is in an on-state during the transmit mode and in an off-state during the receive mode.

13. The transceiver front-end of claim 12, wherein the shunt device comprises a fully depleted planar p-type field effect transistor on the buried insulator layer.

14. A transceiver front-end comprising:

an antenna;

a transmitter branch; and a receiver branch, wherein the antenna, the transmitter branch and the receiver branch are connected to an input/output pad, wherein the transceiver front-end is operable in a transmit mode and a receive mode, and wherein the receiver branch comprises:
a low noise amplifier;
a switch,
  wherein the switch comprises series-connected n-type fin-type field effect transistors on a semiconductor substrate,
  wherein the switch alternatively disconnects the low noise amplifier from the input/output pad and connects the low noise amplifier to the input/output pad,
  wherein, when the low noise amplifier is disconnected from the input/output pad by the switch, the transceiver front-end operates in a transmit mode,
  wherein, when the low noise amplifier is connected to the input/output pad by the switch, the transceiver front-end operates in a receive mode,
  wherein, when the transceiver front-end is in the receive mode, the low noise amplifier amplifies input signals received by the antenna; and
a matching network within the receiver branch between the input/output pad and the low noise amplifier and operably connected to the switch and the low noise amplifier, wherein the matching network provides both impedance matching and electrostatic discharge protection for the switch and the low noise amplifier.

15. The transceiver front-end of claim 14,
wherein the transmitter branch comprises a power amplifier that, during the transmit mode, generates output signals and wherein the transmitter branch further comprises an impedance transformer that couples the power amplifier to the input/output pad allowing the antenna to transmit the output signals, and
wherein a sum of all drain-source voltages of all n-type field effect transistors in the switch is greater than a maximum output voltage of the power amplifier to prevent the switch from turning on during the transmit mode.

16. The transceiver front-end of claim 14,
wherein a region of the substrate aligned below the switch comprises a p-well, an N-well below the P-well and a P– area between the N-well and a bottom surface of the substrate, and
wherein, during the receive mode, the N-well is positively biased and the P-well is discharged to ground.

17. The transceiver front-end of claim 14, wherein the matching network comprises: an inductor and a first capacitor electrically connected in series between ground and an input terminal of the switch and a second capacitor electrically connected between an output terminal of the switch and an input terminal of the low noise amplifier.

18. The transceiver front-end of claim 17,
wherein the receiver branch further comprises a first bias resistor electrically connected to the input terminal of the switch enabling a first bias voltage to be applied to the input terminal of the switch during the transmit mode and the receive mode, and
wherein the receiver branch further comprises a second bias resistor electrically connected to the input terminal of the low noise amplifier enabling a second bias voltage that is equal to an optimal input voltage for the low noise amplifier to be applied to the input terminal of the low noise amplifier during the receive mode.

19. The transceiver front-end of claim 18, the receiver branch further comprising a shunt device downstream of the second capacitor and the second bias resistor and upstream of the low noise amplifier, wherein the shunt device is in an on-state during the transmit mode and in an off-state during the receive mode.

20. The transceiver front-end of claim 19, wherein the shunt device comprises an n-type fin-type field effect transistor, wherein, during the transmit mode, the n-type fin-type field effect transistor is in the on-state and pulls a voltage level at the input terminal to the low noise amplifier to ground effectively shutting off the low noise amplifier.

* * * * *